United States Patent [19]
Chrapacz et al.

[11] Patent Number: 5,656,510
[45] Date of Patent: Aug. 12, 1997

[54] METHOD FOR MANUFACTURING GATE OXIDE CAPACITORS INCLUDING WAFER BACKSIDE DIELECTRIC AND IMPLANTATION ELECTRON FLOOD GUN CURRENT CONTROL

[75] Inventors: Terry Chrapacz, Topton; Kenneth Gordon Moerschel, Bethlehem; William A. Possanza, Northampton; Michael Allen Prozonic, Germansville; Janmye Sung, Lower Macungie Township, Lehigh County, all of Pa.

[73] Assignee: Lucent Technologies Inc., Murray Hill, N.J.

[21] Appl. No.: 344,318

[22] Filed: Nov. 22, 1994

[51] Int. Cl.[6] ........................... H01L 21/318
[52] U.S. Cl. .................... 438/394; 438/476; 438/516; 438/791; 438/928
[58] Field of Search ............... 437/10, 11, 12, 437/20, 235, 238; 148/DIG. 114; 257/355, 606

[56] References Cited

U.S. PATENT DOCUMENTS

| | | | |
|---|---|---|---|
| 4,595,837 | 6/1986 | Wu et al. | 250/492.2 |
| 4,599,792 | 7/1986 | Cade et al. | 437/66 |
| 4,786,814 | 11/1988 | Kolondra et al. | 250/492.2 |
| 4,878,988 | 11/1989 | Hall et al. | 437/13 |
| 5,446,302 | 8/1995 | Beigel et al. | 257/355 |
| 5,477,078 | 12/1995 | Beigel et al. | 257/606 |

OTHER PUBLICATIONS

Ghandhi, "VLSI Fabrication Principles, silicon and gallium arsenide", 1983, pp. 427–430.

*Primary Examiner*—Chandra Chaudhari

[57] ABSTRACT

A method is provided for optimizing the manufacturing yield of semiconductors. The method provides a backside dielectric layer which protects the semiconductor from electro-static discharge damage during manufacturing. The backside dielectric layer may be a nitride. The backside dielectric layer may be an oxide. The method also provides for optimized ion implantation flood gun current control.

14 Claims, 11 Drawing Sheets

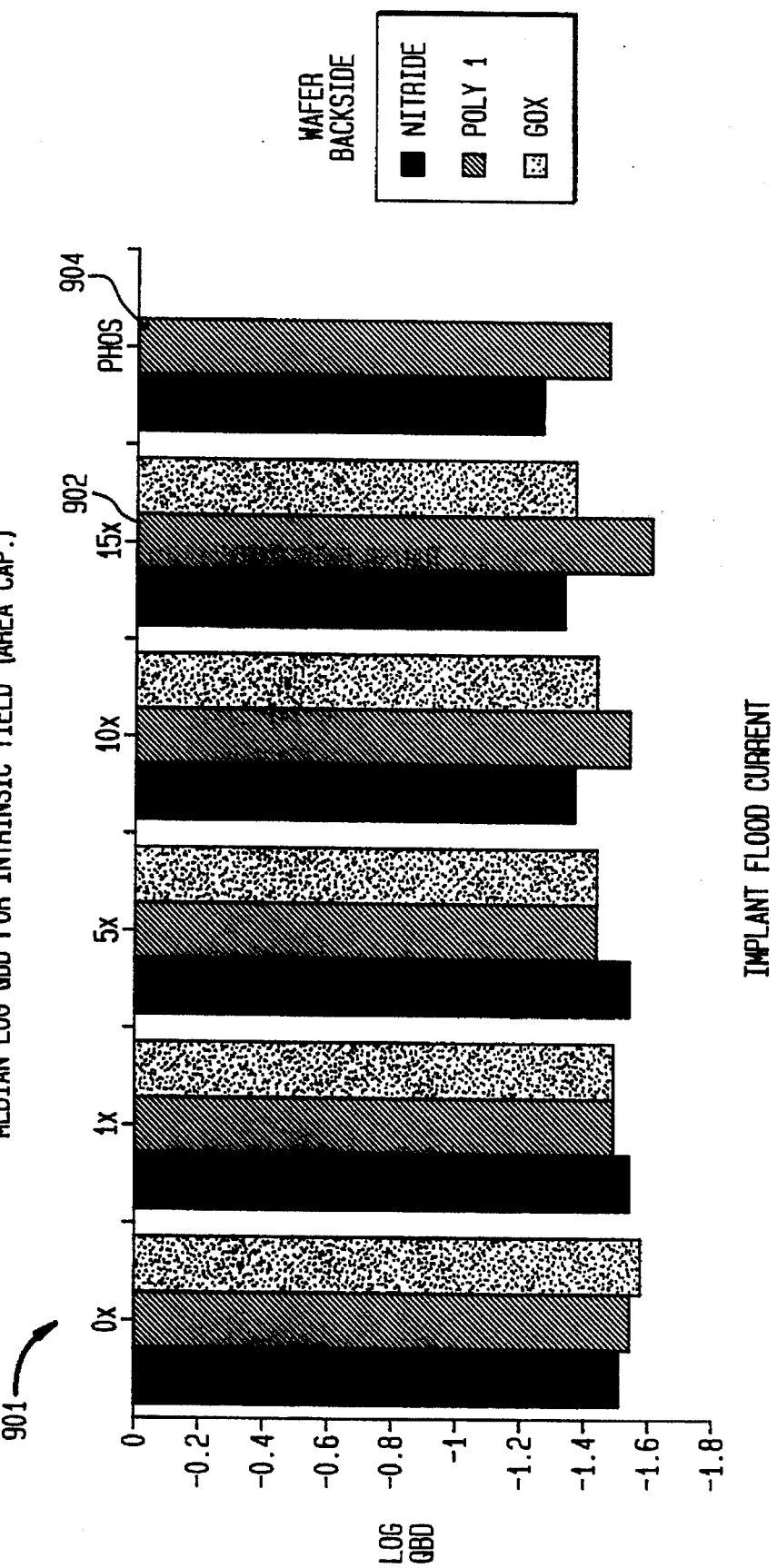

METHOD FOR MANUFACTURING GATE OXIDE CAPACITORS INCLUDING WAFER BACKSIDE DIELECTRIC AND IMPLANTATION ELECTRON FLOOD GUN CURRENT CONTROL

BACKGROUND OF THE INVENTION

1. Field of the Invention

The present invention relates generally to semiconductor devices, and more specifically to an optimized method for manufacturing gate oxide capacitors including addition of a wafer backside dielectric along with optimized electron implantation flood gun current control.

2. Related Art

In general, gate oxide capacitors are well known. Typical manufacturing yields of gate oxide capacitors, as determined by leakage tests and/or J-Ramp testing, can be less than 30%, and are often as low as 4% depending on processing, capacitor size, and gate oxide thickness.

It is believed that the low yield is, at least in part, attributable to electro-static discharge ("ESD") damage occurring during normal manufacturing processes. In particular, ESD damage is believed to occur during an ion implantation step, where wafer charging leads to the formation of destructive dielectric breakdown voltages (and resultant gate oxide damage).

Therefore, what is needed is a method for making gate oxide capacitors that overcomes manufacturing-related ESD damage. Such a method must not, however, introduce any undesired side effects such as decreased gate oxide capacitor performance or excessively high manufacturing costs.

SUMMARY OF THE INVENTION

To achieve the foregoing and in accordance with the purposes of the present invention, as embodied and described herein, the method of the present invention was devised. The method of the present invention optimizes the manufacturing yield of semiconductors, and comprises a step of depositing a dielectric on a silicon wafer or semiconductor material. This dielectric may be deposited on the backside of the silicon wafer or the semiconductor. This backside dielectric protects the silicon wafer or semiconductor material against electro-static discharge related damage during manufacturing. Dielectrics which are normally only deposited on a wafer frontside during manufacturing can also be deposited on the wafer backside. Such a backside dielectric could then be maintained on the wafer backside up to and subsequent to a gate oxide growth.

Alternatively, the method of the present invention comprises the step of depositing a dielectric on the backside of a silicon wafer or semiconductor material to protect the silicon wafer or semiconductor material against electro-static discharge related damage during current driven ion implantation.

The backside dielectric can comprise a nitride layer, an oxide layer, or an oxi-nitride layer. The nitride layer can further comprise a layer of $Si_3N_4$. The oxide layer can further comprise a layer of $SiO_2$.

A still further embodiment of the present invention comprises the steps of: (1) using an ion implantation current to dope said gate oxide capacitor; and (2) adjusting the current to optimize manufacturing yield. Adjusting step (2) can further comprise a step of optimizing a ratio of implantation flood gun current to beam current to a value greater than 10.

BRIEF DESCRIPTION OF THE FIGURES

The foregoing features and advantages of the present invention will be apparent from the following more particular description of the preferred embodiments of the invention, as illustrated in the accompanying drawings, wherein:

FIG. 9 is a bar graph showing the median log of the quality factor ($Q_{bd}$) for intrinsic yield of area capacitors.

DETAILED DESCRIPTION OF THE PREFERRED EMBODIMENT

1. Overview of the Invention

The preferred embodiment of the present invention is now described with reference to the figures where like reference numbers indicate identical or functionally similar elements. Also in the figures, the left most digit of each reference number corresponds to the figure in which the reference number is first used. While specific steps, configurations and arrangements are discussed, it should be understood that this is done for illustrative purposes only. A person skilled in the relevant art will recognize that other steps, configurations and arrangements can be used without departing from the spirit and scope of the present invention.

The method of the present invention comprises an improved manufacturing method for gate oxide capacitors. Manufacturing yield is improved when either of two steps is incorporated: (1) introduction of a backside dielectric on the silicon wafer; and/or (2) optimization of ion implantation flood gun current ratio. Either of these changes to the manufacturing process, taken alone, results in a measurable improvement in manufacturing yield. However, the reason for the improvement based on each of these steps differs. The improvement attributable to the addition of a backside dielectric layer results from the protective effect of the backside layer against ESD-related potentials generated during manufacturing. The improvement attributable to the optimized ion implantation flood current control results from the offsetting effect that the flood gun electron beam has on wafer charging during ion implantation. Each of these improvements is addressed in further detail below.

2. Detailed Manufacturing Process

Figure 1:
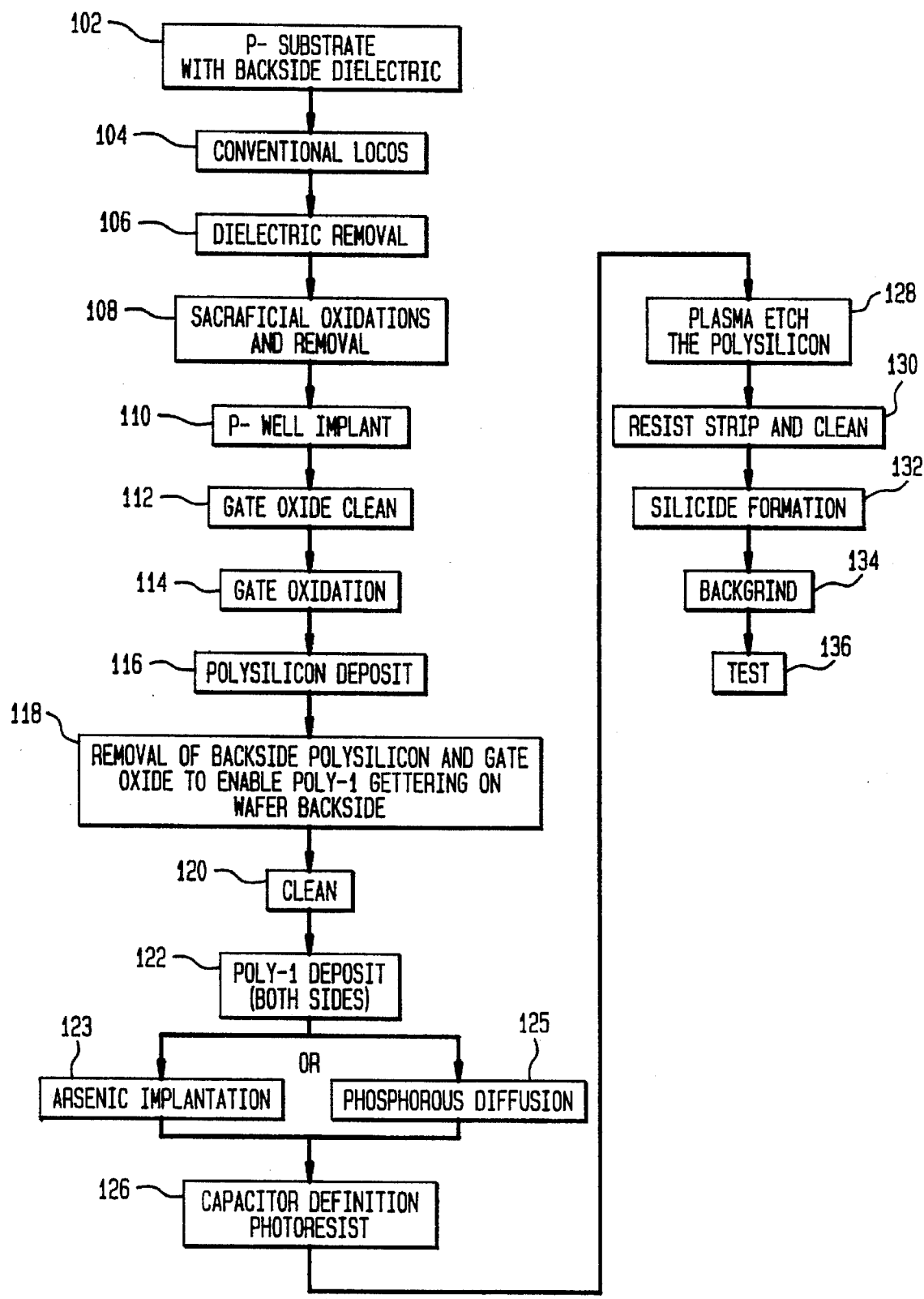
FIG. 1 is a flowchart detailing the manufacturing process of an embodiment of the present invention.

First, however, the process by which test wafers were manufactured according to the present invention will be described in connection with FIGS. 1 and 2. FIG. 1 details the manufacturing process of an exemplary embodiment of the present invention, while FIGS. 2A through 2N depict the major structural phases of a semiconductor manufactured according to this embodiment.

Figure 2A:
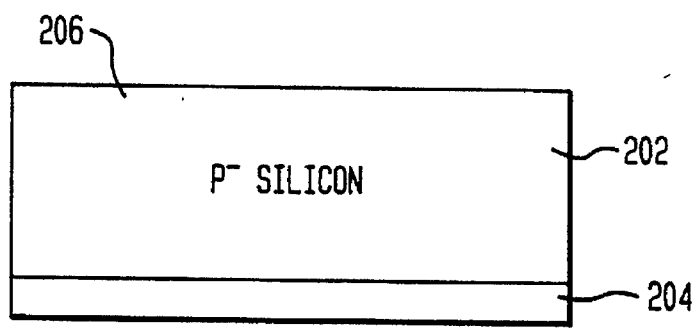
FIGS. 2A–2N are a series of schematic diagrams depicting the structural formation of a semiconductor manufactured according to an embodiment of the present invention.
Figure 2B:
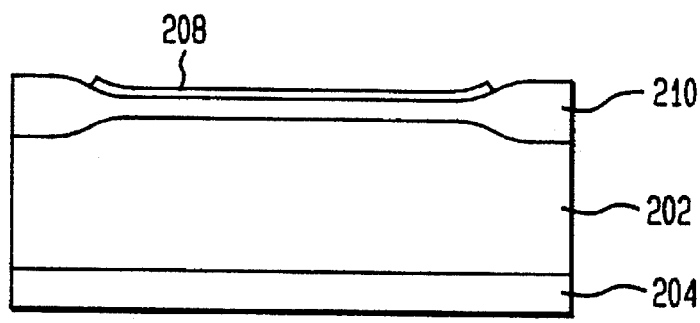
Figure 2C:
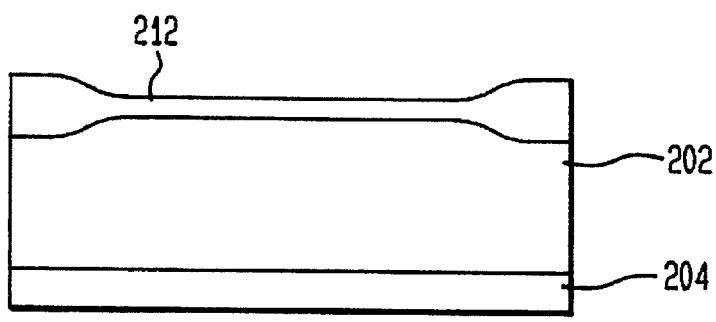

To support experimentation concerning the present invention, and as shown in FIG. 1 step 102 and FIG. 2A, fifty bipolar enhanced self-aligned technology ("BEST") substrates 202 were used. (BEST technology is described more fully in U.S. Pat. Nos. 4,784,971 and 4,824,796, which are incorporated herein by reference.) Referring to both to FIG. 1 and FIG. 2A, sixteen (16) of these had a 1700 Å (e.g., $1.7 \times 10^{-7}$ meters) thick $Si_3N_4$ nitride layer 204 deposited on the backside, according to the present invention. This nitride layer 204 is a backside dielectric, traditionally used for capping wafers that have a high dose of phosphorus or boron (p–/p+) getter. This capping process and, its benefits are described in detail below.

Figure 2D:
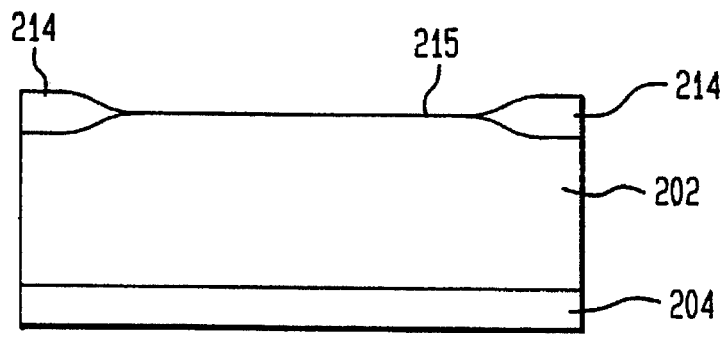

Referring to FIG. 1 steps 104 and 106, conventional local oxidation of silicon ("LOCOS") was utilized to minimize losses from isolation-induced defects. (For further information on LOCOS, see U.S. Pat. Nos. 3,755,001 and 3,852,104, which are incorporated herein by reference.) Next, as shown in FIG. 1 step 108 and FIGS. 2B and 2C, a field oxide 210 was grown according to standard BEST-1 processing. This process employed atmospheric steam to result in oxide growth 6500 Å in thickness. A nitride layer 208 was then used as an oxidation mask. Sacrificial oxides of 450 Å and 150 Å were grown after removal of the front side nitride layer 208, leaving field oxide 214 (only along the periphery of the capacitor). As shown in FIG. 2D, this removal thereby leaves a bare silicon P-Well area 215 surrounded by field oxide.

Figure 2E:
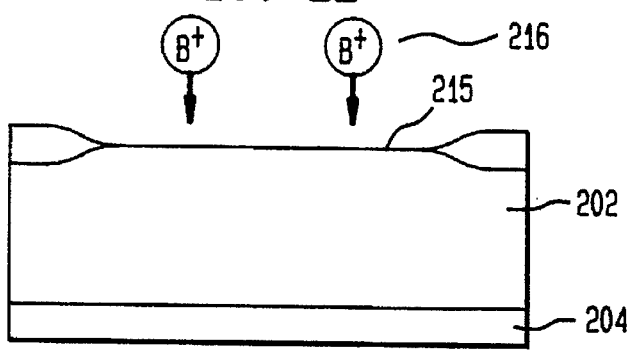
Figure 2F:
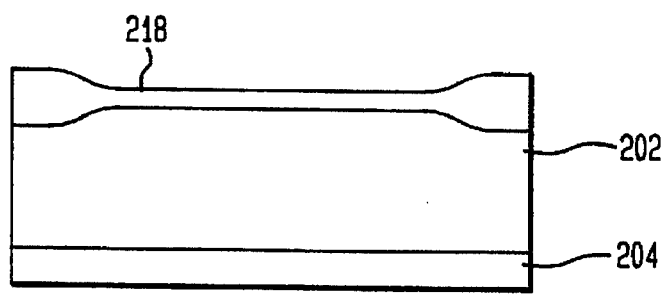

Referring to FIG. 1 step 110 and FIG. 2E, the P-Well 215 was then implanted with boron 216. As shown in FIG. 1 steps 112 and 114, the pre-gate oxide was cleaned with sulfur-peroxide, ammonium-peroxide, and hydrogen-fluoride, in that order, with a Trebor dry and no time delay to oxidation. After cleaning, and as shown in FIG. 2F, $SiO_2$ gate oxide 218 was then grown to a thickness of 150 Å under standard BEST-2 processing.

Figure 2G:
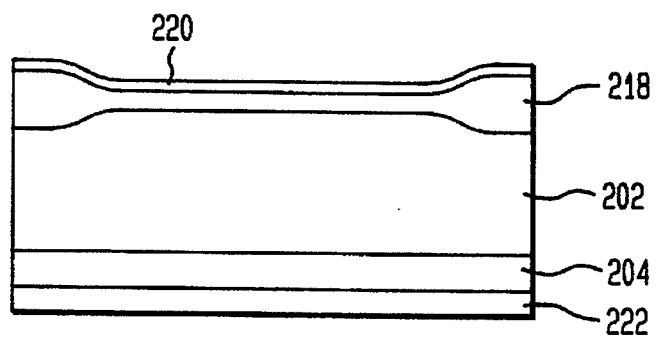
Figure 2H:
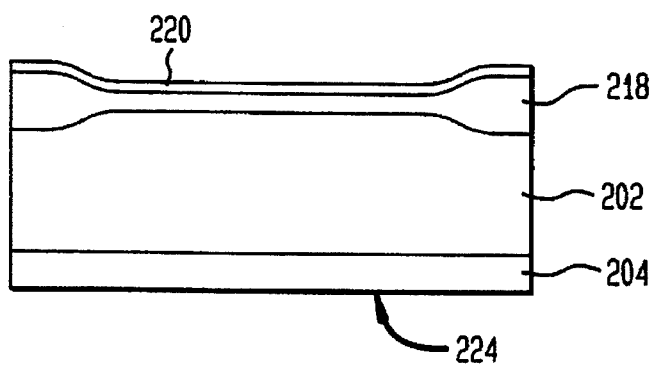
Figure 2I:
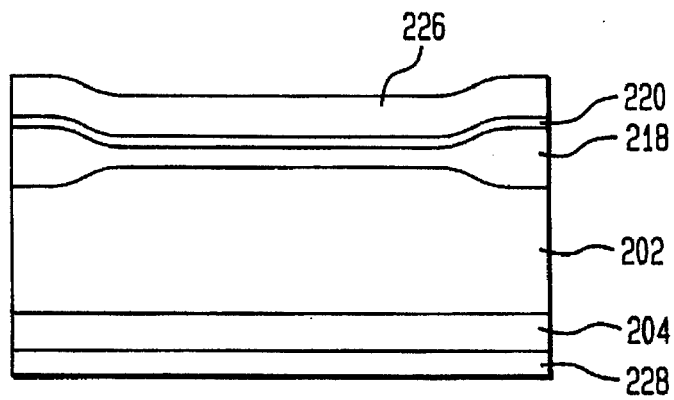

Referring to FIG. 1 step 116 and FIG. 2G, 500 Å of polysilicon 220, 222 was immediately deposited to cap the gate oxide 218 and the backside of the wafer 202. Referring to FIG. 1 step 118 and 120, and FIG. 2H, this polysilicon cap 222 and the gate oxide were then removed from the backside 224 of sixteen wafers (replacing BEST-1 base block and BEST-2 processing) to permit intimate contact of the polysilicon gate (Poly-1) to the backside of the wafer. Referring to FIG. 1 step 122 and FIG. 2I, Poly-1 226, 228 was then deposited to a thickness of 3500 Å to form the gate, or top electrode of the capacitor.

The process described above produced three groups of wafers: (1) wafers with Poly-1 contact to the back; (2) wafers with gate oxide and polysilicon on the back; and (3) wafers with nitride and polysilicon on the back. These three groups were each further divided into six subgroups for doping the polysilicon gate 226.

Figure 2J:
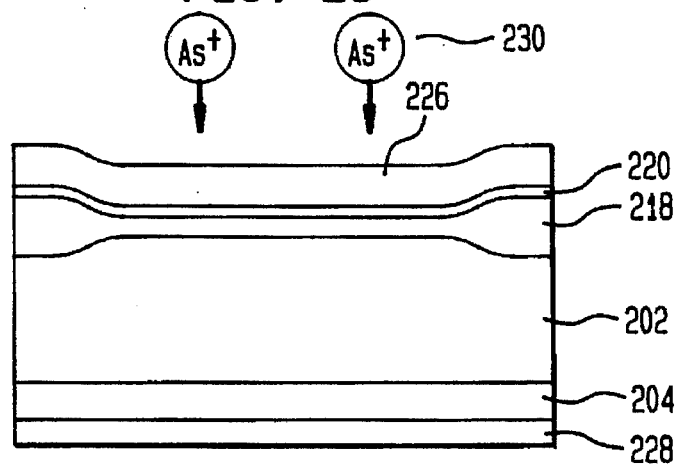

Referring to FIG. 1 step 123 and FIG. 2J, five of the six subgroups for each wafer type were implanted with the BEST-2 arsenic dose 230 at flood currents varying from zero to fifteen times the ion implantation beam current (standard is 10 times). The arsenic implant conditions were $35 \times 10^3$ electron-volts ("35 KeV") beam energy and about $1 \times 10^{16}$ ion dose.

Referring to FIG. 1 step 125, the final subgroup of each wafer type was phosphorus diffused at 950° C. to a sheet resistance of 25 ohms/square. By employing phosphorous diffusion, these subgroups were not exposed to the suspected ESD-related effects associated with flood gun ion implantation.

Figure 2K:
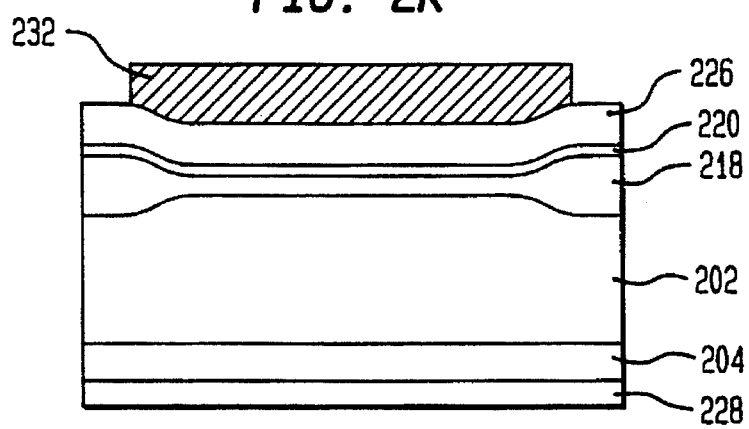
Figure 2L:
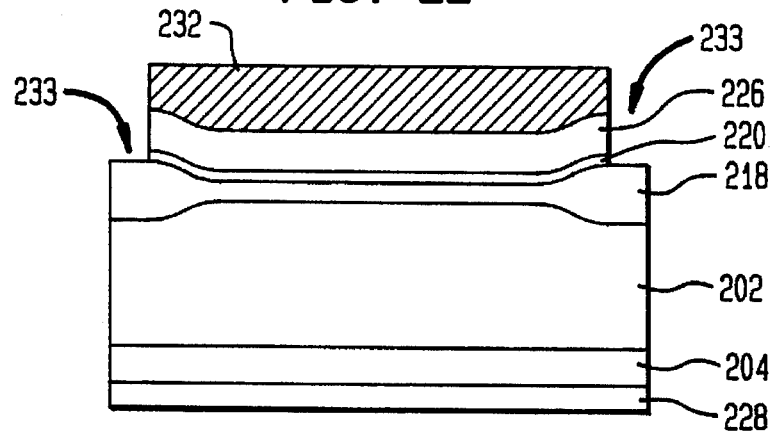

Referring to FIG. 1 steps 126 and 128, and FIG. 2K, the polysilicon gates were then patterned with a photoresist 232 and etched in a plasma etcher (manufactured by LAM Research Corp., 4650 Cushing Parkway, Fremont, Calif. 94538). Referring to FIG. 2L, this process removed the polysilicon 218 and Poly-1 220 that extended beyond the emitter photoresist 232.

Figure 2M:
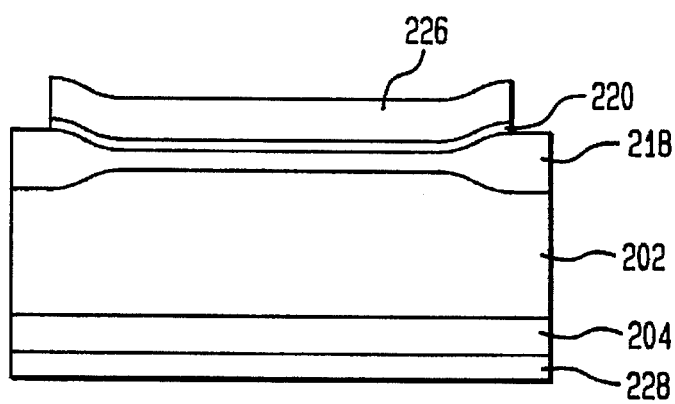
Figure 2N:
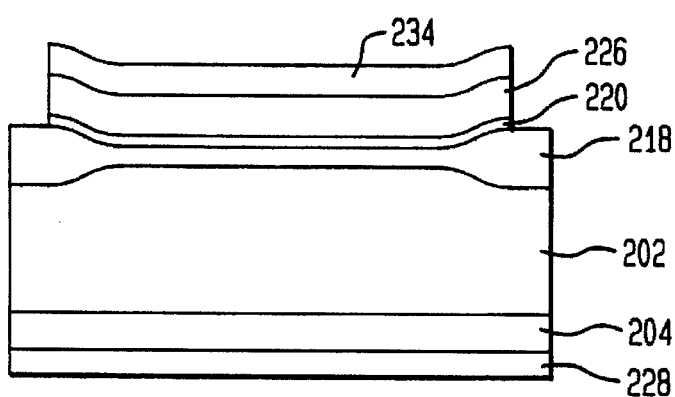

Referring next to FIG. 1 steps 130 and 132, and FIGS. 2L and 2M, a self-aligned silicide was then formed on the devices. The emitter photoresist 232 was stripped, and the Poly-1 226 underneath was cleaned. Referring to FIG. 1 steps 132 and 134, and FIG. 2N, a layer of Platinum-Silicide ("PtSi") 234 was deposited over the Poly-1 226 to form the top plate of the capacitor, and the backside layers 228, 204 were ground off to expose silicon 202.

All six subgroups of the three wafer types were then mapped for leakage and J-Ramp on an HP Model 4062 UX D.C. Parametric Test Set (available from Hewlett-Packard Company, 3000 Hanover Street, Palo Alto, Calif. 94304). The test measurements were taken using small probes in contact with the top plate 234 and bottom plate 202 (after backgrind) of the capacitor. This testing produced 108 data points for each implant cell (36 sites/wafer, 3 wafers/cell).

Two types of gate oxide capacitors were tested: (1) area capacitors (Area=0.0025 cm$^2$); and (2) TDDB capacitors (Area=0.05 cm$^2$). TDDB capacitors are large area gate oxide capacitors, with TDDB referring to the type of testing typically employed to test large area capacitors ("Time Dependent Dielectric Breakdown"). Because of their large size, TDDB capacitors typically have more potential failure sites and therefore lower initial manufacturing yields than small area ("area") capacitors. Detailed results for each of these experiments is described below.

3. Introduction of a Backside Dielectric

As discussed in the Background section, conventional manufacturing of gate oxide capacitors has inherently resulted in a low manufacturing yield. Manufacturing yield can be determined by either leakage testing and/or J-Ramp testing. Leakage testing involves applying a bias between the top and bottom plates of a capacitor, and measuring leakage current. J-Ramp testing involves progressively introducing charge into a capacitor until the capacitor breaks down. Under either of these tests, manufacturing yield of gate oxide capacitors is generally below 30%, and often below 4% (where the leakage test threshold is $\leq 1$ μA at 7 V bias; and the J-Ramp test threshold is log $Q_{bd} > -4$).

This low manufacturing yield is caused by electro-static discharge ("ESD") damage occurring during the manufacturing process. One likely source of this ESD can be explained with reference to FIG. 3. Electron flow into the silicon wafer results in the development of a charge (φ) on the wafer during ion implantation of the Poly-1 layer 302. The voltage (potential) that develops on the surface of the wafer can be determined from Eq. 1.

$$V = \frac{q \phi t}{K \epsilon_o} \quad \text{Eq. 1}$$

where:

$q = 1.6 \times 10^{-19}$ coulomb (Boltzman's constant);

φ is the accumulated charge in ions/cm$^2$;

t is the dielectric thickness in cm;

K is the relative dielectric constant; and $\epsilon_o$ is the permittivity of free space ($8.85 \times 10^{-14}$ farad/cm).

Figure 3:
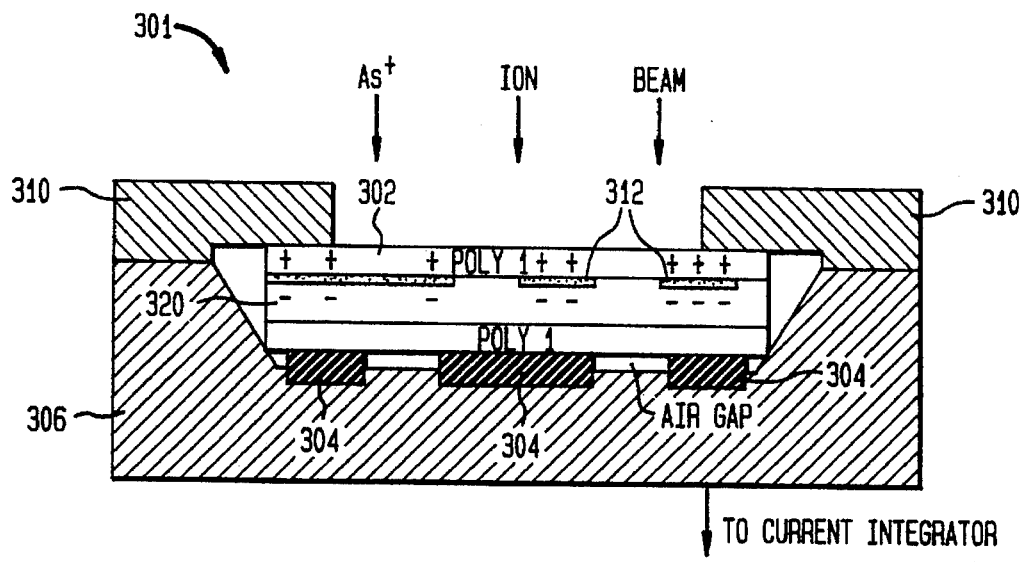
FIG. 3 depicts a cross sectional view of a gate oxide capacitor with standard Poly-1 frontside and backside layers installed in an apparatus used for ion implantation.

The voltage is therefore directly proportional to the accumulated charge. As seen in FIG. 3, two pathways exist for the dissipation of charge accumulated in the wafer: (1) by electron leakage through the rubber support blocks 304; and (2) by electron flow through the ion implanter clamps 310. Therefore, accumulated positive charge on the Poly-1 layer can only be neutralized by electron flow through these two paths. Passage of electrons through the wafer results in conduction through the gate oxide, and therefore damage to the oxide. As shown in FIG. 3, the backside Poly-1 (or bare silicon) would allow conduction through the wafer. The backside dielectric layer prevents this.

Applying Eq. 1, if a charge of only $1 \times 10^{14}$ ions/cm$^2$ had accumulated at any given instant, the resulting voltage across a 150 Å thick gate oxide (e.g., gate oxide 312) would be 70 V. This value would surpass the intrinsic breakdown voltage of thermally grown $SiO_2$ (which is about $10^7$ volts/cm) by a factor of 4.6. Such a charge would therefore likely result in ESD damage to the gate oxide 312 on silicon wafer 320.

Figure 5:
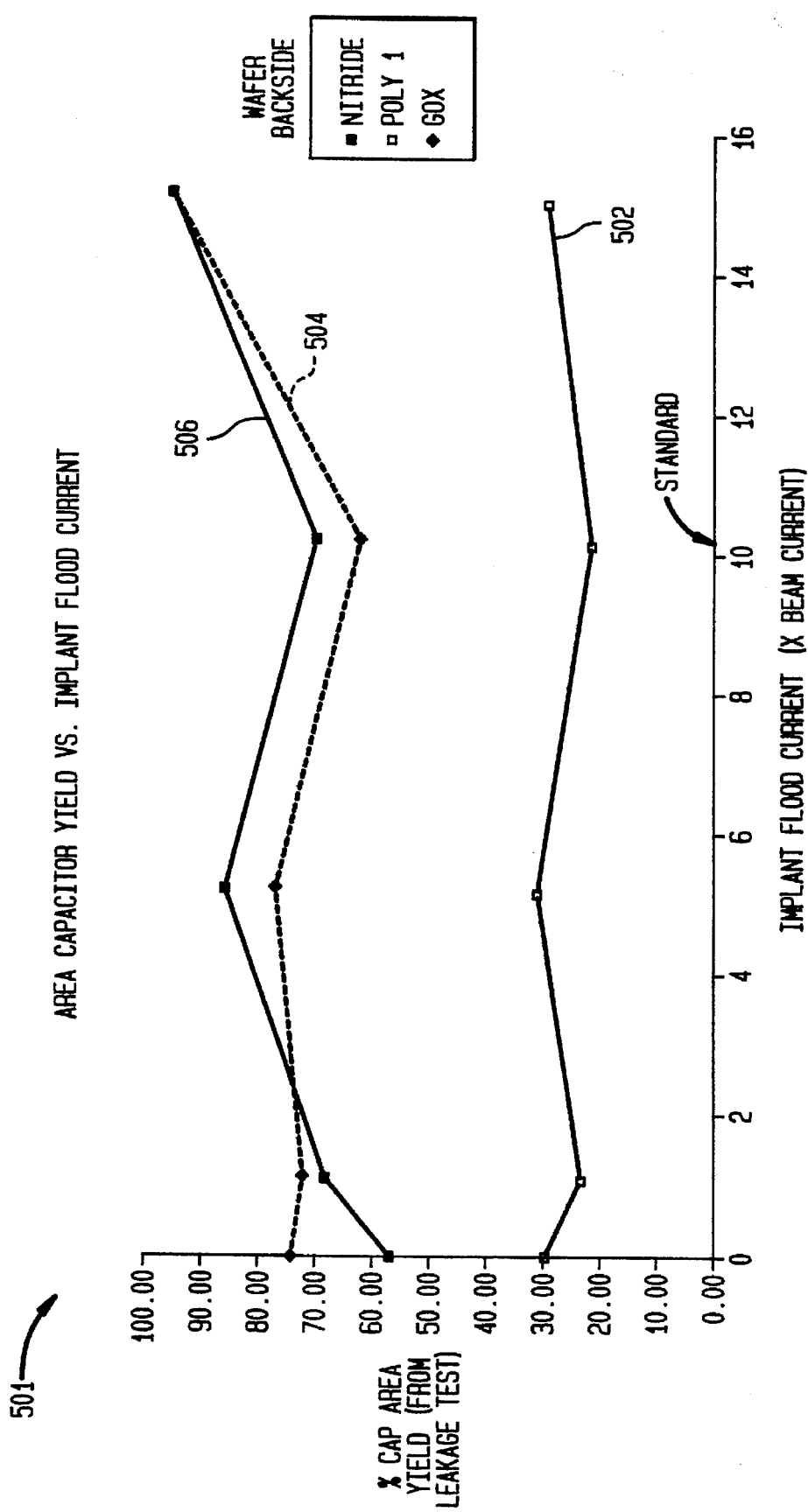
FIG. 5 is a graph showing the manufacturing yield of small area capacitors as a function of implantation flood gun current and wafer backside formulation as determined by leakage testing.

Experiments to optimize manufacturing yield as a function of backside dielectric and/or ion implantation flood gun current control were performed by the inventors on several device types. These device types included "area" capacitors and "TDDB" capacitors. In addition, wafers having phosphorous diffused backsides and frontsides were also tested as control wafers (e.g., wafers not exposed to ion implantation, and therefore not subject to potentially damaging ESD). FIG. 5 depicts the results of leakage testing performed on area capacitors manufactured according to a method of the present invention. The manufacturing percent yield for area capacitors (Area=0.0025 cm$^2$) was plotted as a function of each of three wafer backside configurations (Poly-1, Nitride or GOX, described in further detail below) and ion implantation flood gun current. The leakage test threshold limit was set at $\leq 1$ µA ("$1 \times 10^{-6}$ A") at 7 V bias. As FIG. 5 shows, the yield of devices manufactured with either a nitride backside layer 506 or a GOX backside layer 504 was significantly higher than the manufacturing yield for devices manufactured with the standard Poly-1 backside 502. The nitride layer was formed of 1700 Å thick $Si_3N_4$, 500 Å thick polysilicon, and 3500 Å thick polysilicon, deposited on the backside of the silicon wafer in that order. The thickness of the $Si_3N_4$ nitride layer may acceptably be varied from 50 Å to 10,000 Å, with a thickness of over 1,000 Å preferred. The nitride layer may comprise a PLASMA nitride layer. Similarly, the GOX layer was formed of gate oxide, 500 Å thick polysilicon, and 3500 Å thick polysilicon, deposited on the backside of the silicon wafer in that order. Each of these configurations provided significant advantages over the standard Poly-1 configuration.

Figure 6:
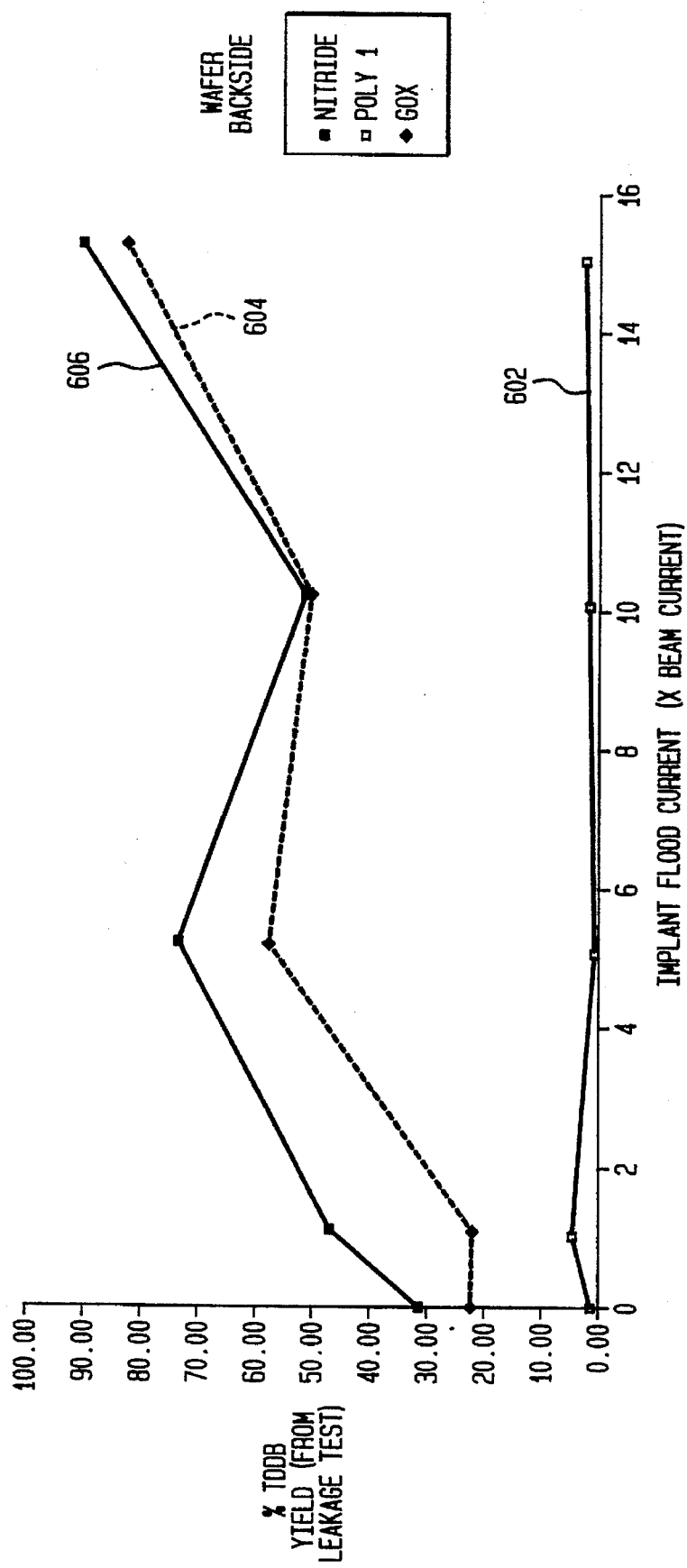
FIG. 6 is a graph showing the manufacturing yield of large area capacitors as a function of implantation flood gun current and wafer backside formulation as determined by leakage testing.

FIG. 6 depicts the results of a similar experiment performed on TDDB capacitors (Area=0.05 cm$^2$). The percent yield (also as determined by leakage testing where the threshold was set $\leq 1$ µA at 7 V bias) was plotted as a function of wafer backside configuration (Poly-1, nitride or GOX) and ion implantation flood gun current. As FIG. 6 shows, the addition of either the nitride backside layer 606 or the GOX backside layer 604 resulted in a significant improvement in manufacturing yield over the standard Poly-1 configuration 602. As discussed above, this is due to the ESD related protection provided by the nitride or GOX layers.

Figure 7:
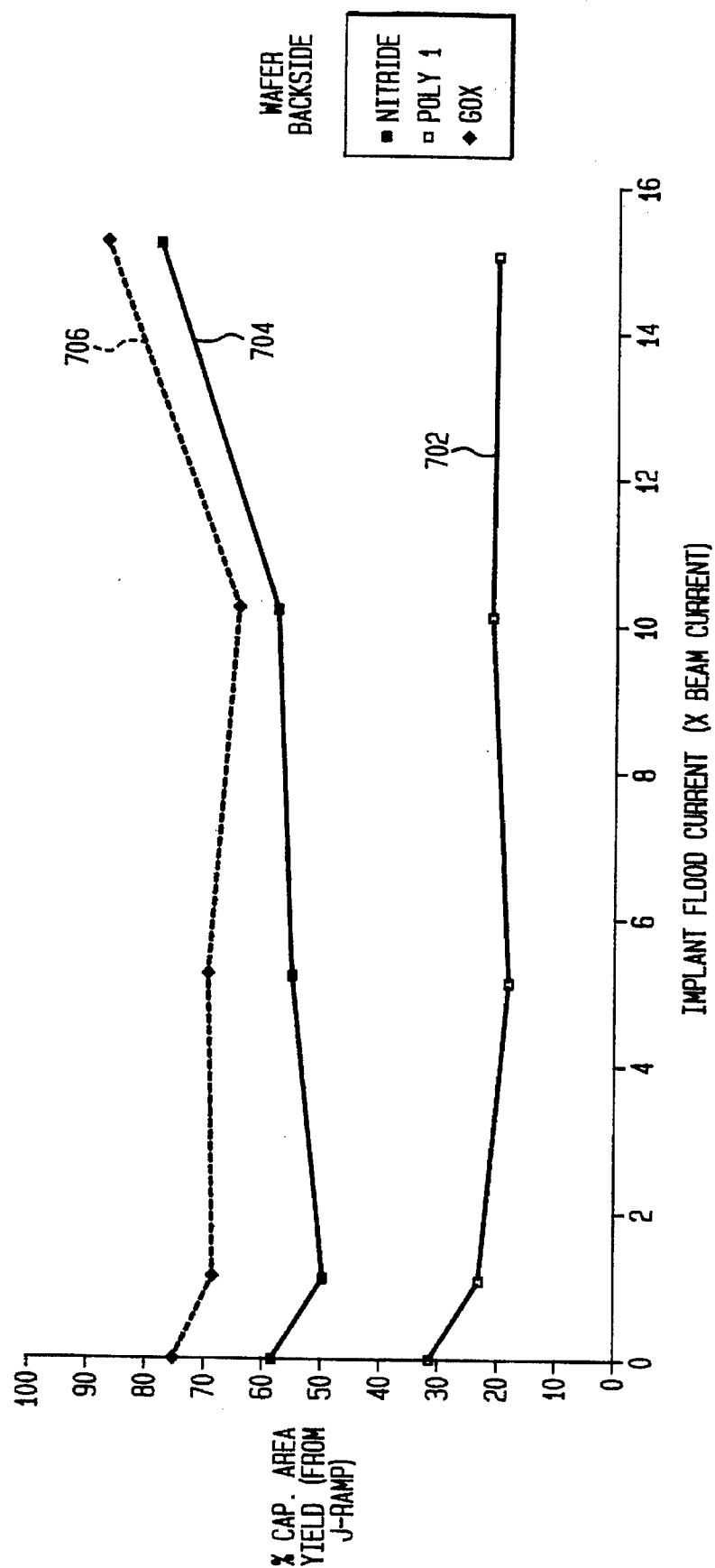
FIG. 7 is a graph showing the manufacturing yield of area capacitors as a function of implantation flood gun current and wafer backside formulation as determined by J-Ramp testing.

FIG. 7 depicts the results of another experiment performed on area capacitors (A=0.0025 cm$^2$). The percent yield (as determined by J-Ramp testing, where the threshold was set at log $Q_{bd}$>-4) of the area capacitors was plotted as a function of backside configuration (Poly-1, nitride or GOX) as well as ion implantation flood gun current. Similar to the other test results, the manufacturing yield showed an overall increase with a change from the standard Poly-1 manufacturing process 702 to either the nitride 704 or the GOX 706 backside formulations.

Together, FIG. 5, FIG. 6 and FIG. 7 clearly illustrate that the inclusion of a backside dielectric layer on the gate oxide capacitors, even without optimized implantation flood gun current control, resulted in a significant increase in manufacturing yield over standard configurations. This increased manufacturing yield is due to the ESD-protective effect resulting from the backside dielectric layer.

Figure 4:
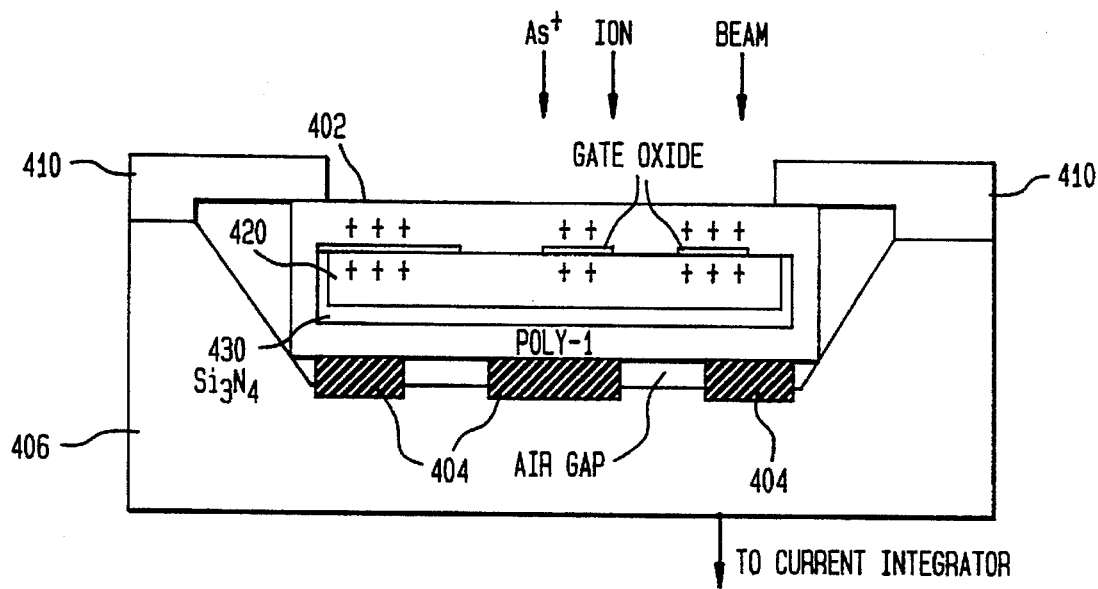
FIG. 4 depicts a cross sectional view of a gate oxide capacitor with a nitride backside dielectric layer according to the method of the present invention installed in an apparatus used for ion implantation.

FIG. 4 depicts a cross sectional view of a gate oxide capacitor with a nitride ($Si_3N_4$) backside dielectric layer according to the method of the present invention. In FIG. 4, the silicon wafer 420 is installed in an apparatus 406 used for ion implantation. The presence of nitride ($Si_3N_4$) layer 430 between silicon wafer 402 and rubber mounting blocks 404 serves to remove one of the two conduction paths present during ion implantation. The two possible conduction paths are: (1) current flow through the implantation apparatus wafer clamps 410; and (2) current flow through rubber mounting blocks 404 and the wafer. With the backside dielectric layer 430, only the current path through wafer clamps 410 remains. Because the wafer backside and sides are insulated with the nitride ($Si_3N_4$) dielectric layer 430, the entire wafer floats electrically relative to the implantation apparatus support disk 406; thereby avoiding any damaging voltage differentials internal to the silicon wafer 420. With the backside dielectric layer 430 incorporated, all excess charge in silicon wafer 420 developed during ion implantation will be compensated for by electron flow through wafer clamp 410 and onto the surface of the Poly-1 402. This compensating flow of electrons minimizes the buildup of potentially damaging ESD potentials within the wafer.

4. Optimization of Ion Implantation Beam Current

In addition to incorporating a backside dielectric layer, the process improvement according to another embodiment of the present invention includes optimized control over the ion implantation flood gun current. One step in the manufacturing process of gate oxide capacitors involves the implantation of ions into the Poly-1 layer, which forms the upper electrode of the gate oxide capacitor. Ion implantation current is generally expressed in terms of the ratio of implant flood gun current to actual beam current. The standard manufacturing implantation flood current is "10×", or ten times that of the beam current.

Therefore, in an attempt to improve the manufacturing yield of gate oxide capacitors, the inventors varied the implantation flood gun current from 0 (zero) to 15 (fifteen) times the beam current for each of the wafer configurations evaluated above.

The effect of the varied implantation flood gun current according to this embodiment of the present invention is clear. The improvement in manufacturing yield for TDDB capacitors is shown in FIG. 6. The standard wafer configuration 602 (conductive wafer backside) benefitted little from varied implantation flood gun current, with yield values ranging from near 0% to a maximum of approximately 4%. The percentage yield varied significantly, however, for the nitride backside configuration 606 and the GOX configuration 604. The maximum yield, in excess of 80% for both the Nitride 606 and GOX 604 backside configurations, occurred at a beam current ratio of approximately 15×.

Similar results were obtained with the area capacitors evaluated. Referring first to FIG. 5, the results from leakage testing can be examined. As shown in FIG. 5, the yield of the standard Poly-1 (conductive backside) configuration 502 remained almost constant with variations in implantation flood gun current ratio. The nitride 506 and GOX 504 configurations, however, benefitted significantly with variation in the implantation flood gun current. For both of these configurations, the maximum manufacturing yield was achieved at an implantation flood current ratio of approximately 15×.

J-Ramp testing of area capacitors produced similar results, as depicted in FIG. 7. As FIG. 7 shows, the standard wafer configuration 702 (Poly-1) benefitted little over varying beam current ratios. However, each of the backside dielectric configurations (Nitride 706 and GOX 704) benefitted significantly, with peak manufacturing yields also occurring at around 15×.

In each of these evaluations, a VARIAN 120-10 (available from Varian Associates, Inc., 611 Hansen Way, Palo Alto, Calif. 94303-0883) was used to implant the ion dose, operating at a 6 mA ("$6\times10^{-3}$ A") beam current. With this setup, the maximum attainable ion implantation flood gun current was 15× (15 times that of the beam current). With lower beam currents, even higher ion implantation flood gun current to beam current ratios will be possible (e.g., 30×). These higher current ratios may potentially result in even higher manufacturing yields.

5. Phosphorous Diffusion

In order to verify that the increased yield associated with the backside dielectric was due to the ESD protective effect of the backside dielectric, phosphorous diffusion was utilized to dope the Poly-1 on several of the test wafers. Referring to step 125 of FIG. 1, by employing phosphorous diffusion instead of flood gun ion implantation, these wafers would not be subjected to damaging potentials developed during ion implantation. Test results of the phosphorous diffused wafers, therefore, should compare favorably with those of the wafers with the backside dielectric. In addition, the phosphorous diffused wafers should have higher yields that the standard Poly-1 wafers that were subjected to flood gun ion implantation.

To ensure an effective "control" group, phosphorous diffusion was utilized on both area and TDDB capacitors, with both nitride and standard Poly-1 backside formulations. The phosphorous diffusion was performed at 950° C., to a sheet resistance of 25 ohms/square. The results achieved are presented in Table 1.

TABLE 1

| Device | Wafer Backside | Test Method | % Yield |
| --- | --- | --- | --- |
| Area Capacitor (Phos) | Nitride | Leakage Test | 97 |
| Aria Capacitor (Phos) | Poly-1 | Leakge Test | 27 |
| TDDB Capacitor (Phos) | Nitride | Leakage Test | 94 |
| TDDB Capacitor (Phos) | Poly-1 | Leakage Test | 3 |
| Area Capacitor (Phos) | Nitride | J-Ramp | 94.4 |
| Area Capacitor (Phos) | Poly-1 | J-Ramp | 22.2 |

These results clearly show that the primary failure mechanism of gate oxide capacitors is ESD related damage during manufacturing. As expected, phosphorous diffused area and TDDB capacitors exhibited a high manufacturing yield. In addition, increased manufacturing yield was also experienced when phosphorous diffusion was employed on both capacitor types without backside dielectrics. The low yield of the TDDB capacitors is likely to the increased ESD susceptibility of TDDB devices due to their large size.

6. Further Evaluation

In addition to the leakage and J-Ramp testing performed to determined manufacturing yield, additional tests were performed to confirm that the optimized manufacturing process did not have any deleterious effect on the gate oxide capacitors. Towards this end, both total intrinsic capacitor yield and median log $Q_{bd}$ of intrinsic yield were examined.

Figure 8:
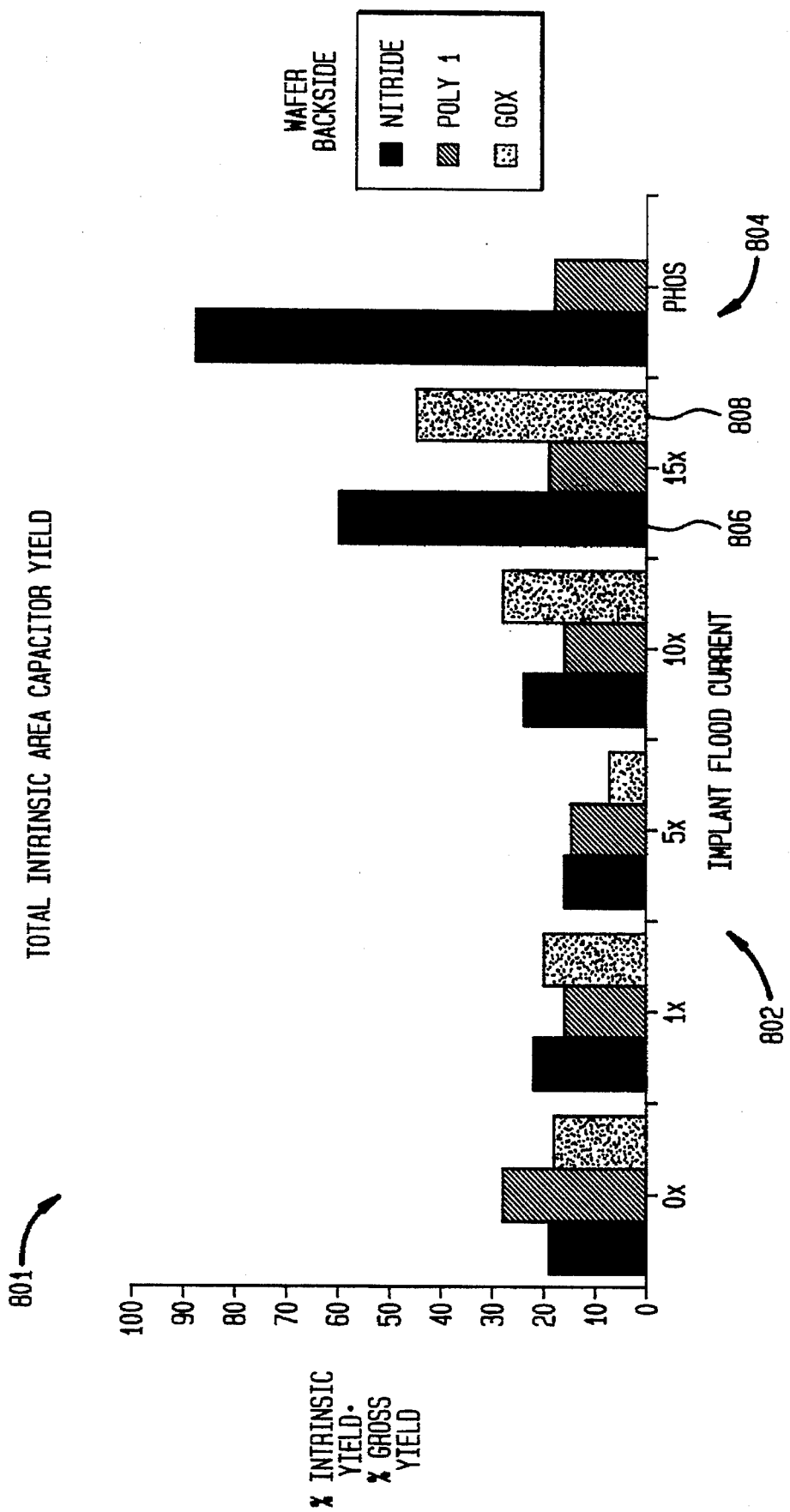
FIG. 8 is a bar graph showing total intrinsic capacitor yield as a function of implantation flood gun current.

FIG. 8 depicts the total intrinsic J-Ramp yield (percentage intrinsic yield times percentage gross yield) as a function of implantation flood current for the area capacitor samples 802, as well as total intrinsic J-Ramp yield for the phosphorous diffused samples 804. Of these categories, the phosphorous diffused nitride wafers 804 exhibited the highest total percentage yield (approximately 90%). Of the ion implanted groups, the 15× Nitride wafers 806 had the highest yield (approximately 60%), followed by the 15× GOX wafers 808 (approximately 45%). The yield of all of these was significantly higher than that of the Poly-1 wafers evaluated, which had no backside dielectric.

FIG. 9 depicts the median log $Q_{bd}$ for intrinsic yield as a function of implantation flood gun current for the ion implanted area capacitor samples, as well as the median log $Q_{bd}$ for the phosphorous diffused samples. The differences in log $Q_{bd}$ versus implantation flood current were not as well defined as those regarding capacitor yield. The wafers implanted at 15× beam current ratio 902 and phosphorous diffused 904 groups had the highest value of log $Q_{bd}$, although the differences were relatively small. Together, the data summarized in FIG. 8 and FIG. 9 indicate that the electron flood implantation current can be increased without any deleterious effect on $Q_{bd}$.

While the present invention has been particularly shown and described with reference to a preferred embodiment thereof, it will be understood by those skilled in the art that various changes in form and details can be made therein without departing from the spirit and scope of the invention.

What is claimed is:

1. A method for manufacturing gate oxide capacitors formed in a silicon wafer or a semiconductor material, comprising the step of depositing a dielectric over a first surface of said silicon wafer or said semiconductor material to protect said gate oxide capacitors formed over a second surface of said silicon wafer or said semiconductor material, wherein said first surface is opposite said second surface, and wherein said dielectric protects each of said gate oxide capacitors against damage produced by electrostatic discharge during ion implantation.

2. The method of claim 1, wherein said dielectric is deposited on the backside of said silicon wafer or said semiconductor.

3. The method of claim 2, wherein said step of depositing a dielectric further comprises a step of depositing a dielectric before said ion implantation.

4. The method of claim 2, wherein said dielectric further comprises a nitride layer.

5. The method of claim 4, wherein said nitride layer further comprises a layer of $Si_3N_4$.

6. The method of claim 5, wherein said $Si_3N_4$ layer is deposited to a thickness within the range of greater than 1,000 Å to 10,000 Å.

7. The method of claim 4, wherein said nitride layer further comprises a layer of PLASMA nitride.

8. The method of claim 2, wherein said dielectric further comprises an oxi-nitride layer.

9. The method of claim 2, further comprising the steps of:

using an ion implantation current to dope said gate oxide capacitors; and adjusting said ion implantation current to increase a manufacturing yield of said gate oxide capacitors.

10. The method of claim 9, wherein said adjusting step further comprises a step of optimizing a ratio of implantation flood gun current to beam current to a value greater than 10.

11. The method of claim 2, wherein said dielectric further comprises an oxide layer.

12. The method of claim 9, wherein step (1) further comprises the step of removing excess charges arising from said ion implantation current, from said silicon wafer or said semiconductor material using a wafer clamp.

13. The method of claim 10, wherein said beam current is an arsenic ion beam.

14. The method of claim 10, wherein said beam current has a value of approximately 6 milliamperes.

* * * * *